(12) United States Patent  
Chu

(10) Patent No.: US 7,109,409 B2
(45) Date of Patent: Sep. 19, 2006

(54) MAGNETIC FIELD ENHANCED PHOTOVOLTAIC DEVICE

(75) Inventor: Chia-Fan Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/022,794

(22) Filed: Dec. 28, 2004

(65) Prior Publication Data
US 2006/0096633 A1    May 11, 2006

(30) Foreign Application Priority Data
Nov. 5, 2004    (TW) .............................. 93133856 A

(51) Int. Cl.
*H01L 31/04* (2006.01)
*H01L 31/0216* (2006.01)

(52) U.S. Cl. .................. 136/254; 136/252; 136/256; 136/263; 257/431; 257/461; 257/40; 257/43

(58) Field of Classification Search .............. 136/252, 136/256, 263, 254; 257/431, 461, 40, 43
See application file for complete search history.

(56) References Cited

U.S. PATENT DOCUMENTS

| | | | | | |
|---|---|---|---|---|---|
| 3,143,448 | A | * | 8/1964 | Mette et al. ................. | 428/687 |
| 3,226,225 | A | * | 12/1965 | Weiss et al. ............. | 252/62.3 E |
| 3,408,499 | A | * | 10/1968 | Weiss ....................... | 250/214.1 |
| 4,051,465 | A | * | 9/1977 | Brody ......................... | 365/117 |
| 4,173,497 | A | * | 11/1979 | Schmidt et al. ............. | 136/255 |
| 4,236,938 | A | * | 12/1980 | Brody ......................... | 136/254 |
| 4,355,195 | A | * | 10/1982 | Sansbury ..................... | 136/254 |
| 4,535,195 | A | * | 8/1985 | Morimoto et al. ........... | 136/258 |
| 4,839,059 | A | * | 6/1989 | Leupold ..................... | 335/210 |
| 5,584,941 | A | * | 12/1996 | Nishida ....................... | 136/258 |
| 5,711,804 | A | * | 1/1998 | Tench et al. .................. | 117/4 |
| 6,639,143 | B1 | * | 10/2003 | Kim et al. .................. | 136/256 |
| 2003/0230333 | A1 | * | 12/2003 | Kashyap ..................... | 136/243 |

FOREIGN PATENT DOCUMENTS

| | | | |
|---|---|---|---|
| JP | 57-190235 A | * | 11/1982 |
| JP | 62-105482 A | * | 5/1987 |
| JP | 11-204818 A | * | 7/1999 |
| JP | 2001-53329 A | * | 2/2001 |
| JP | 2001-328192 A | * | 11/2001 |

OTHER PUBLICATIONS

Dugaev et al, "Modeling of magnetically controlled Si-based optoelectronic devices," Physica E: Low-dimensional Systems and Nanostructures, vol. 16, issues 3-4, Mar. 2003, pp. 558-562.*

(Continued)

*Primary Examiner*—Alan Diamond
(74) *Attorney, Agent, or Firm*—Birch, Stewart, Kolasch & Birch, LLP

(57) ABSTRACT

A magnetic field enhanced photovoltaic device includes a photoelectric conversion layer, a first electrode, a second electrode, a ferro-antiferromagnetic exchange coupling layer and an applied magnetic field. The first electrode and the second electrode are respectively disposed on two surfaces of the photoelectric conversion layer to collect electrons and holes generated by the photoelectric conversion layer. The first electrode is pervious to light. The incident light reaches the photoelectric conversion layer through the first electrode. The applied magnetic field polarizes the spin state of electrons. The ferro-antiferromagnetic exchange coupling layer adjoins the photoelectric conversion layer and pins the spin state of electrons.

15 Claims, 2 Drawing Sheets

OTHER PUBLICATIONS

M. Gich et al, "High-coercively ultralight transparent magnets", Applied Physics Letters, vol. 82, No. 24, Jun. 16, 2003.*

M. Gich, et al. "High-coercivity ultralight transparent magnets" Applied Physics Letters, V. 82, No. 24, Jun. 16, 2003 pp. 4307-4309.

Huynh et al. "Hybrid Nanorod-Polymer Solar Cells" Science V. 295, Mar. 29, 2002, pp. 2425-2427.

Prinz, "Magnetoelectronics" Science V. 282, Nov. 27, 1998, pp. 1660-1663.

* cited by examiner

MAGNETIC FIELD ENHANCED PHOTOVOLTAIC DEVICE

FIELD OF THE INVENTION

The invention relates to a photovoltaic device, and particularly to a magnetic field enhanced photovoltaic device.

BACKGROUND OF THE INVENTION

A photovoltaic device (including a solar energy battery) is different from the regular battery. A photovoltaic device converts light into electrical energy, its P-N junction structure when exposed to incident light generates large quantities of electron-hole pairs, and in the meantime electrons carrying negative electricity and holes carrying positive electricity migrate to the N-type semi-conductor and P-type semi-conductor respectively. This process produces electricity.

During the conversion process, not all the incident sunlight can be absorbed and converted to electricity by the photovoltaic device. One section of the light spectrum does not contribute to the battery's output due to its low energy (which should be greater than semi-conductor's energy gap). When the photovoltaic device receives light of that particular section of the spectrum, instead of converting its energy into electron-hole generation, the photovoltaic device can only release its energy in the form of heat. In the laboratory, the photovoltaic device can almost reach the highest light-electricity-conversion level theoretically allowed, but in reality due to the complexity of the mass manufacturing process cost-effective high-efficient photovoltaic devices cannot be produced. Currently, this is the biggest bottleneck in making photovoltaic devices.

At present, the development of photovoltaic devices can be divided into two areas; one area focuses on how to capture light and convert the light energy to electricity efficiently; the other area focuses on how to reduce cost in material and manufacturing processes. The former area can be further divided into the following sub-categories: reducing incident light reflection; improving the design of the metal electrode or adding an anti-reflection layer between component layers to reduce reflection and increase the amount of light getting into the semi-conductor material; or reducing inner resistance of the photovoltaic device to increase conversion efficiency, wherein metal electrodes are imbedded in the substrate to increase the contact surface while reducing serial resistance. Two or more photovoltaic devices can be combined to form a tandem cell, where the device absorbing the high-energy spectrum is placed on top while the device absorbing the low-energy spectrum is placed on the bottom; together, they form a high voltage photovoltaic device.

SUMMARY OF THE INVENTION

The invention incorporates a magnetic field to enhance the efficiency of the photovoltaic device. The additional magnetic field in the photovoltaic device will polarize the spin state of electrons that migrate inside the photovoltaic device. For example, a ferro-antiferromagnetic layer interfacing with a coupling layer produces an exchange coupling effect and pins the spin state of electrons, which reduces scattering probability during electron transmission, reduces internal resistance and increases conversion efficiency.

An electron possesses two intrinsic characteristics: charge and spin, which can be considered as smallest units for electricity and magnetism. In the traditional design of a photovoltaic device, only the effect of electron's charge characteristic is considered while its spin characteristic is overlooked. Due to the latest development in nano-technology, it has become feasible to control the spin of electrons to reduce resistance and improve efficiency. The characteristic of magnetic resistance is stated in differential spin scattering theory, that is, when the spin direction of migrating electrons is parallel to that of the conducting material they are migrating through, and the probability of electron scattering is reduced. Therefore, a photovoltaic device incorporated with a magnetic field can change its overall magnetic resistance, a phenomenon called "magnetic resistance." The combination of ferro-magnetic and ferro-antiferromagnetic layers can produce an exchange coupling effect, in which the spin state of nearby migrating-through electrons is pinned by the anti-ferromagnetic layer.

A magnetic photovoltaic device, based on the above-mentioned theory to increase the photoelectric conversion efficiency, includes a photoelectric conversion layer, a first electrode, a second electrode, a ferro-antiferromagnetic exchange coupling layer and an applied magnetic field. The first electrode and the second electrode are respectively disposed on two surfaces of the photoelectric conversion layer to collect electrons and holes generated by the photoelectric conversion layer. The first electrode is pervious to light, which reaches to the photoelectric conversion layer through the first electrode, where the light energy is converted into electron-hole pairs. In the meantime, the applied magnetic field polarizes the spin state of electrons, and the ferro-antiferromagnetic exchange coupling layer adjoining the photoelectric conversion layer produces an exchange coupling effect, which creates extra magnetic bias on the junction and pins the spin state of electrons and further fixes the spin direction of electrons. Thus, if the spin directions of electrons are parallel to the direction of the magnetic field, the electron transmission resistance can be greatly reduced and its diffusion length increased. The process reduces the recombination probability of electrons and holes and hence increases photoelectric conversion efficiency. Hence, an additional hard magnetic layer in photovoltaic device provides the needed magnetic field and ensures the spin directions of electrons are the same as the direction of the magnetic field.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the following detailed description and the accompanying drawings, which are given by way of illustration only, and thus are not limitative of the present invention, and in which.

DETAILED DESCRIPTION OF THE INVENTION

Figure 1:
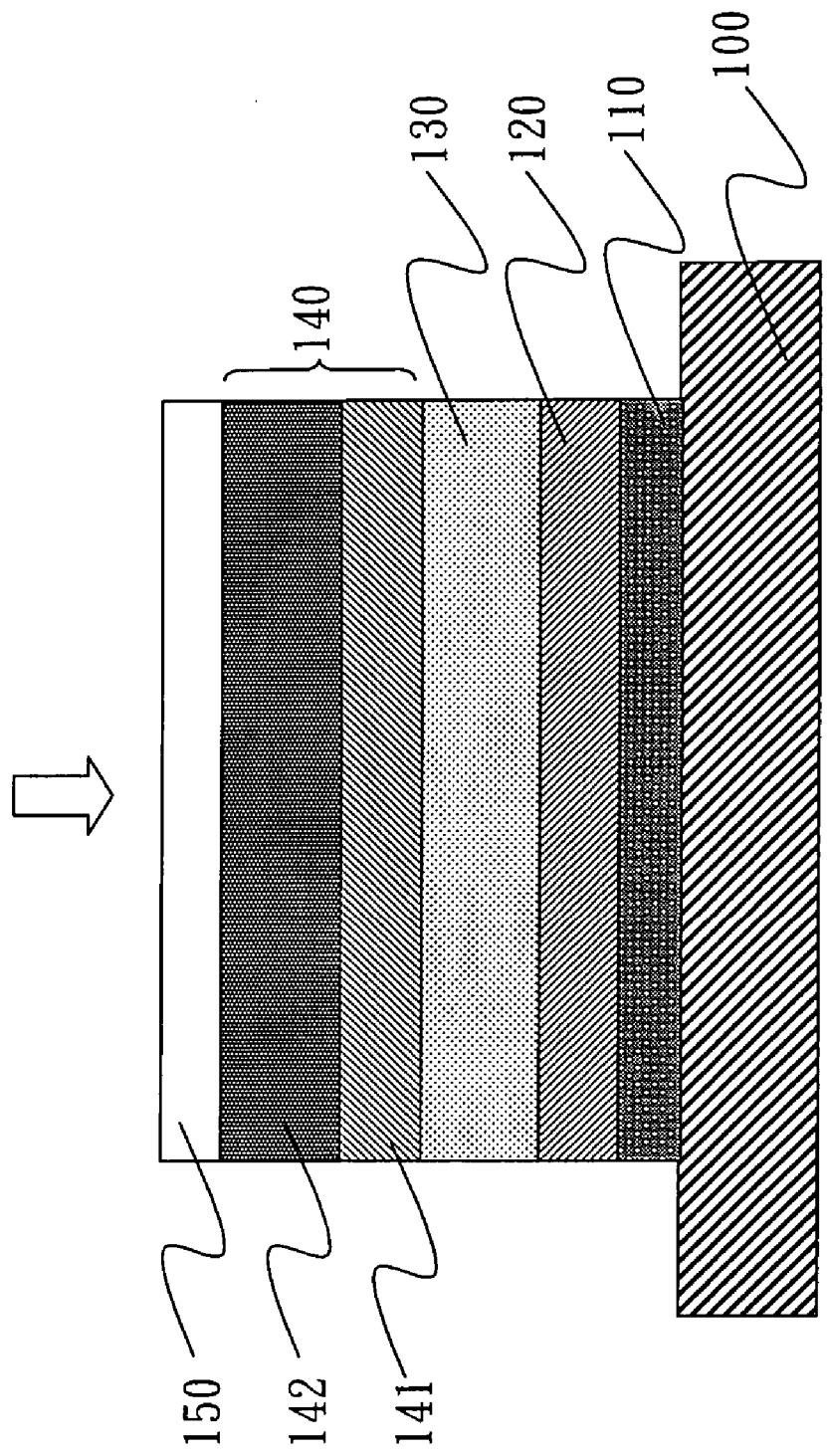
FIG. 1 is a cut-cross display of the first embodiment of the invention.

Reference will now be made in detail to the preferred embodiments of the invention, examples of which are illustrated in the accompanying drawings. Wherever possible, the same reference numbers are used in the drawings and the description to refer to the same or like parts.

A magnetic field enhanced photovoltaic device of invention can be applied to all kinds of photovoltaic devices, no matter what material is used, e.g., Single Crystal, Polycrystal, Amorphous, or Quantum dot, Nano-Wire, Nano-Rod and Qunatum Well arranged with nanocrystal.

For different kinds of photovoltaic devices, such as P-N semi-conductor solar battery, nano-rod solar battery or dye photoactivated solar battery, their photoelectric conversion layers can be P-N junction semi-conductor layers, a nano-rod and high polymer mixed layer or a photoactivated layer. The first electrode has to be pervious to light, so conducting glass having a layer of FTO, ITO or IZO, etc., is used for the layer. Because the second electrode is affected by the applied magnetic field to produce the same directional spin, a magnetic layer, Iron, cobalt or nickel or other metal or alloys can be used. To increase design flexibility of the photovoltaic device, transparent strong magnetic material, such as $Nd_2Fe_{14}B$, can be used as the hard magnetic layer to provide the applied magnetic field. Since the hard magnetic layer is pervious to light, it can adjoin the first electrode. While the ferro-antiferromagnetic exchange coupling layer adjoining the photoelectric conversion layer consists of a ferro-magnetic layer and an antiferro-magnetic layer, the ferro-magnetic layer can be first formed with nickel metal, and then its surface can be oxidized to form nickel oxide as the antiferromagnetic layer.

With reference to FIG. 1, on the top of substrate 100 is a first transparent $Nd_2Fe_{14}B$ layer 110, a nickel electrode 120 having a thickness less than 20 nm, a third P-N junction semi-conductor layer, a forth ferro/anti-ferromagnetic exchange coupling layer and a last FTO electrode 150. Together they make up a P-N semi-conductor solar battery. The transparent $Nd_2Fe_{14}B$ layer 110 is formed on the surface of the substrate 100, and then the nickel electrode 120 is formed on top of the $Nd_2Fe_{14}B$ layer. On top of the nickel electrode 120 is a P-N junction semi-conductor layer 130. The FTO electrode 150 and the ferro/anti-ferromagnetic exchange coupling layer 140 are on the other side of the P-N junction semi-conductor layer, where the thickness of the FTO electrode 150 is less than 30 nm, and the thickness of the ferro-magnetic layer of the ferro/anti-ferromagnetic layer is less than 20 nm, which allows light to pass through. The ferro/anti-ferromagnetic exchange coupling layer 140 consists of a nickel layer 141 and nickel oxide 142, where the nickel layer 141 adjoins the P-N junction semi-conductor layer 130 and nickel oxide 142 is formed on the surface of the nickel layer 141. Finally, the FTO electrode 150 lies on top of the nickel oxide layer. When sunlight passes through the FTO electrode 150, the ferro/anti-ferromagnetic exchange coupling layer 140 reaches to the P-N junction semi-conductor layer 130, where the light energy is converted into electrons-hole pairs. Due to the applied magnetic field of the $Nd_2Fe_{14}B$ layer 110, electrons and holes generated by the P-N junction have the same directional spin states before being collected by the nickel electrode 120 and the FTO electrode 150, respectively. The exchange coupling effect created between the ferro-magnetic nickel layer 141 and the anti-ferromagnetic nickel oxide 142 pin down the spin state of those electrons when they pass through them.

Figure 2:
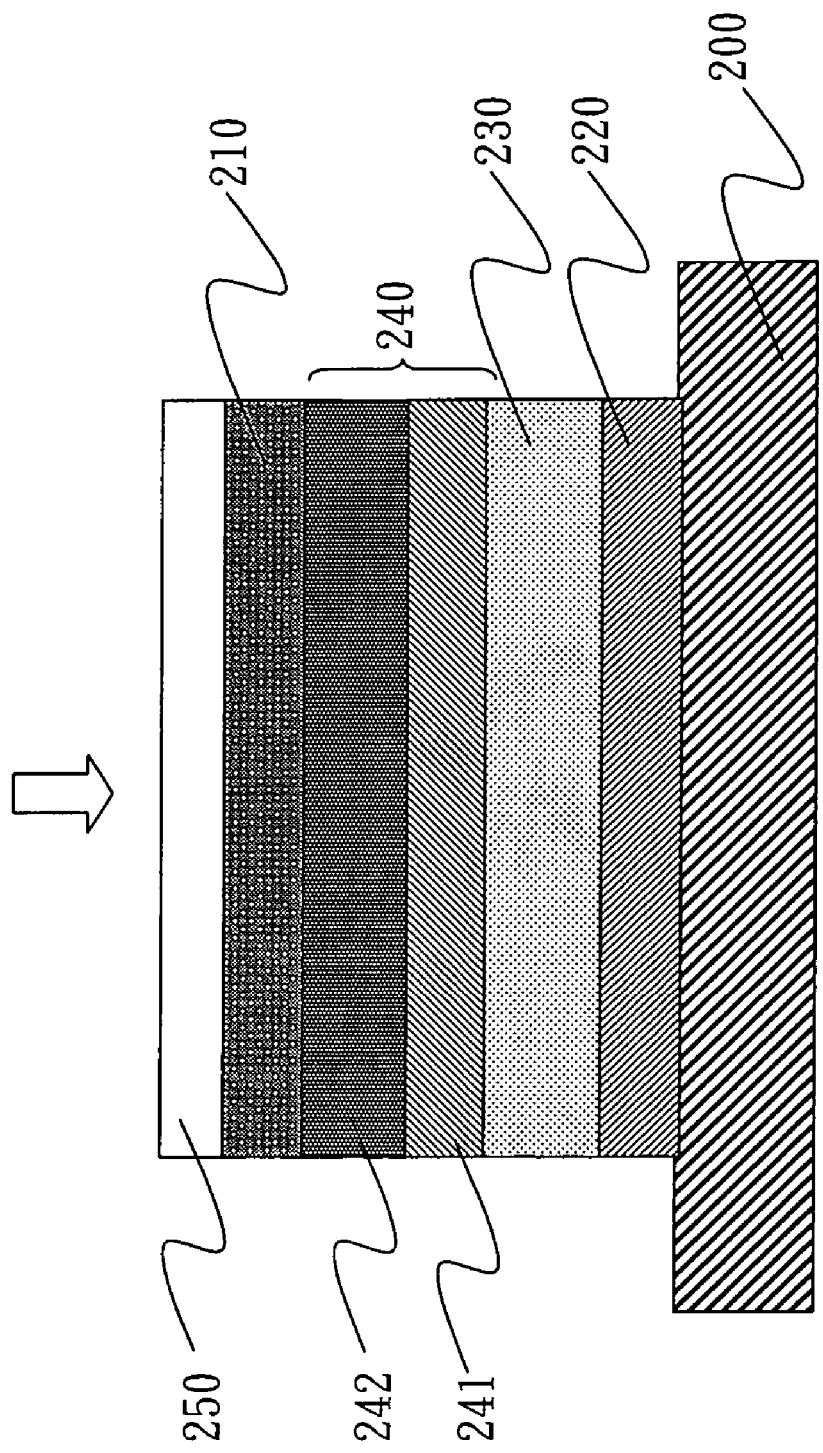
FIG. 2 is a cut-cross display of the second embodiment of the invention.

In addition, if the hard magnetic layer is made of transparent $Nd_2Fe_{14}B$, it can be placed on the side to receive light. For example, the nano-rod solar battery in FIG. 2 includes nickel electrode 220 having a thickness less than 20 nm on the surface of the substrate 200, the CdSe nano-rod and poly-(3-hexylthiophene) mixed layer 230 having a thickness less than 30 nm, the ferro magnetic layer of the ferro/anti-ferromagnetic exchange coupling layer 240 having a thickness less than 20 nm, the transparent $Nd_2Fe_{14}B$ layer 210 and the FTO electrode 250. In more detail, the CdSe nano-rod and poly-(3-hexylthiophene) mixed layer 230 is used as a photoelectric layer to produce electrons and holes. The nickel electrode 220 lies directly on top of the substrate, the CdSe nano-rod and poly-(3-hexylthiophene) mixed layer 230 covers the nickel electrode 220 covered by the Ferro/anti-ferromagnetic exchange coupling layer 240. The $Nd_2Fe_{14}B$ layer 210 and the FTO electrode 250 are on the other side of the CdSe nano-rod and poly-(3-hexylthiophene) mixed layer 230 where light can pass through. The ferro/anti-ferromagnetic exchange coupling layer 240 consists of a nickel layer 241 and a nickel oxide layer 242, where the nickel layer 241 adjoins the CdSe nano-rod and poly-(3-hexylthiophene) mixed layer 230 and a nickel oxide layer 242 is formed on the surface of the nickel layer 241. Lastly, the $Nd_2Fe_{14}B$ layer 210 and the FTO electrode 250 stay on top of the nickel oxide. Sunlight passes through the ferro/anti-ferromagnetic exchange coupling layer 240, the $Nd_2Fe_{14}B$ layer 210 and the FTO electrode 250, reaches the CdSe nano-rod and poly-(3-hexylthiophene) mixed layer 230, the CdSe nano-rod and poly-(3-hexylthiophene) mixed layer 230 produces electrons and holes which migrate to the nickel electrode 220 and the FTO electrode 250 respectively. Since the electrons are affected by the applied magnetic fields from the $Nd_2Fe_{14}B$ layer 210 and the ferro/anti-ferromagnetic exchange coupling layer 240, they have the same directional spin state.

Additionally, the above-mentioned ferro/anti-ferromagnetic exchange coupling layers are comprised of the nickel layer and a nickel oxide layer, where the nickel layer adjoins the photoelectric conversion layer and a nickel oxide layer is formed on top of the nickel layer. Because nickel oxide has a higher energy gap, it can absorb the higher energy part of the sunlight. Nickel oxide, the nickel layer and the FTO electrode together form another solar battery, absorbing different energy levels of light.

While an illustrative and presently preferred embodiment of the invention has been described in detail herein, it is to be understood that the inventive concepts may be otherwise variously embodied and employed and that the appended claims are intended to be construed to include such variations except as limited by the prior art.

What is claimed is:

1. A magnetic field enhanced photovoltaic device, comprising:
   a photoelectric conversion layer to receive incident light and produce a plurality of electrons and holes;
   a first electrode and a second electrode located on two sides of said photoelectric conversion layer to collect passing electrons and holes in order to produce electrical energy, said first electrode is pervious to light and allows light to reach said photoelectric conversion layer;
   an applied magnetic field, exerted on said photoelectric conversion layer to force passing electrons' spin state consistent with said applied magnetic field;
   a ferro/anti-ferromagnetic exchanges coupling layer adjoining the photoelectric conversion layer, said ferro/anti-ferromagnetic exchanges coupling layer providing exchange coupling effects and providing extra magnetic bias to pin down a spin state of passing electrons generated by said photoelectric conversion layer.

2. The magnetic field enhanced photovoltaic device as claimed in claim 1, wherein said photoelectric conversion layer comprises a P-N junction semi-conductor, a nano-rod and polymer mixed layer, or a dye photoactivated layer.

3. The magnetic field enhanced photovoltaic device as claimed in claim 2, wherein said nano-rod and polymer mixed layer is a CdSe nano-rod and poly-(3-hexylthiophene) mixed layer.

4. The magnetic field enhanced photovoltaic device as claimed in claim 1, wherein said first electrode is a transparent conducting glass.

5. The magnetic field enhanced photovoltaic device as claimed in claim 4, wherein said transparent conducting glass comprises a transparent conduction layer.

6. The magnetic field enhanced photovoltaic device as claimed in claim 1, wherein said second electrode is a magnetic layer.

7. The magnetic field enhanced photovoltaic device as claimed in claim 6, wherein said second electrode is selected from the group consisting of iron, cobalt, nickel and their alloys.

8. The magnetic field enhanced photovoltaic device as claimed in claim 1, wherein said applied magnetic field is provided by a hard magnetic layer.

9. The magnetic field enhanced photovoltaic device as claimed in claim 8, wherein said applied magnetic field is provided by a hard magnetic layer which adjoins said second electrode.

10. The magnetic field enhanced photovoltaic device as claimed in claim 8, wherein said applied magnetic field is provided by a hard magnetic layer made of $Nd_2Fe_{14}B$.

11. The magnetic field enhanced photovoltaic device as claimed in claim 8, wherein said applied magnetic field is provided by a hard magnetic layer made of a transparent strong magnetic material.

12. The magnetic field enhanced photovoltaic device as claimed in claim 11, wherein said applied magnetic field is provided by a hard magnetic layer which adjoins said first electrode.

13. The magnetic field enhanced photovoltaic device as claimed in claim 1, wherein said ferro/anti-ferromagnetic exchanges coupling layer is made of a ferro magnetic layer and an anti-ferro magnetic layer.

14. The magnetic field enhanced photovoltaic device as claimed in claim 13, wherein said ferromagnetic layer is a nickel layer.

15. The magnetic field enhanced photovoltaic device as claimed in claim 13, wherein said anti-ferro magnetic layer is a nickel oxide layer.

* * * * *